United States Patent [19]

Moisin

[11] Patent Number: 6,091,288

[45] Date of Patent: Jul. 18, 2000

[54] INVERTER CIRCUIT WITH AVALANCHE CURRENT PREVENTION

[75] Inventor: Mihail S. Moisin, Brookline, Mass.

[73] Assignee: Electro-Mag International, Inc., N. Scituate, Mass.

[21] Appl. No.: 09/073,774

[22] Filed: May 6, 1998

[51] Int. Cl.[7] ........................................ G05F 1/10
[52] U.S. Cl. .................. 327/545; 327/547; 327/168; 363/55; 363/131
[58] Field of Search ................................ 327/110, 168, 327/545, 546, 547; 363/55, 56, 131, 132

[56] References Cited

U.S. PATENT DOCUMENTS

| | | | |
|---|---|---|---|
| 3,808,481 | 4/1974 | Rippel | 318/139 |
| 4,115,729 | 9/1978 | Young et al. | 322/86 |
| 4,164,785 | 8/1979 | Young et al. | 363/50 |
| 4,270,164 | 5/1981 | Wyman et al. | 363/56 |
| 4,415,839 | 11/1983 | Lesea | 315/308 |
| 4,423,363 | 12/1983 | Clark et al. | 318/375 |
| 4,480,298 | 10/1984 | Fry | 307/31 |
| 4,489,373 | 12/1984 | du Parc | 363/56 |
| 4,507,698 | 3/1985 | Nilssen | 361/42 |
| 4,525,648 | 6/1985 | De Bijl et al. | 315/224 |
| 4,572,988 | 2/1986 | Handler et al. | 315/209 |
| 4,608,958 | 9/1986 | Sakakibara et al. | 123/605 |
| 4,618,810 | 10/1986 | Hagerman et al. | 318/803 |
| 4,624,334 | 11/1986 | Kelledes et al. | 180/79.1 |
| 4,675,576 | 6/1987 | Nilssen | 315/242 |
| 4,682,083 | 7/1987 | Alley | 315/307 |
| 4,684,851 | 8/1987 | Van Meurs | 315/224 |
| 4,689,731 | 8/1987 | Walker et al. | 363/24 |
| 4,712,045 | 12/1987 | Van Meurs | 315/224 |
| 4,783,728 | 11/1988 | Hoffman | 363/37 |
| 4,818,917 | 4/1989 | Vest | 315/171 |
| 4,864,486 | 9/1989 | Spreen | 363/126 |
| 4,866,586 | 9/1989 | Suko | 363/5 |
| 4,870,327 | 9/1989 | Jorgensen | 315/307 |
| 4,899,382 | 2/1990 | Gartner | 379/413 |
| 4,952,853 | 8/1990 | Archer | 318/254 |
| 4,991,051 | 2/1991 | Hung | 361/57 |
| 5,003,231 | 3/1991 | Perper | 315/291 |

(List continued on next page.)

FOREIGN PATENT DOCUMENTS

| | | |
|---|---|---|
| 0 291 120 | 11/1988 | European Pat. Off. . |
| 0460641 | 12/1991 | European Pat. Off. . |
| 0522266 | 1/1993 | European Pat. Off. . |
| 4010435 | 10/1991 | Germany . |
| 4032664 | 4/1992 | Germany . |
| 63-002464 | 11/1988 | Japan ............................ H02H 9/08 |
| XP002900559 | 5/1992 | U.S.S.R. . |
| 2204455 | 11/1988 | United Kingdom . |
| WO 90/07820 | 7/1990 | WIPO . |
| 9422209 | 9/1994 | WIPO . |
| 9535646 | 12/1995 | WIPO . |

OTHER PUBLICATIONS

"Simple Dimming Circuit for Fluorescent Lamp", IBM Technical Disclosure Bulletin, vol. 34, No. 4A, Sep. 1, 1991, pp. 109–111, XP000210848.

Marian Kazimierczuk et al., "*Resonant Power Converters*", 1995, pp. 332–333.

International Search Report dated Aug. 24, 1999.

*Primary Examiner*—Timothy P. Callahan
*Assistant Examiner*—Hai L. Nguyen
*Attorney, Agent, or Firm*—Nutter, McClennen & Fish LLP

[57] ABSTRACT

An electronic circuit includes first and second inductive bias elements coupled to respective first and second switching elements for preventing avalanche current flow through the switching elements. In one embodiment, a resonant inverter circuit includes first and second switching elements with first and second freewheeling diodes coupled across the respective switching elements. A first inductive bias element is coupled to the first switching element and a second inductive bias element is coupled to the second switching element. The first and second bias elements are inductively coupled with a resonant inductive element for biasing the respective first and second switching elements against avalanche current flow.

24 Claims, 5 Drawing Sheets

U.S. PATENT DOCUMENTS

| | | | |
|---|---|---|---|
| 5,004,955 | 4/1991 | Nilssen | 315/119 |
| 5,014,305 | 5/1991 | Moisin | 379/402 |
| 5,027,032 | 6/1991 | Nilssen | 315/103 |
| 5,052,039 | 9/1991 | Moisin | 379/402 |
| 5,063,339 | 11/1991 | Orii et al. | 318/696 |
| 5,081,401 | 1/1992 | Moisin | 315/324 |
| 5,124,619 | 6/1992 | Moisin et al. | 315/219 |
| 5,138,233 | 8/1992 | Moisin et al. | 315/187 |
| 5,138,234 | 8/1992 | Moisin | 315/209 |
| 5,138,236 | 8/1992 | Bobel et al. | 315/209 |
| 5,144,195 | 9/1992 | Konopka et al. | 315/94 |
| 5,148,087 | 9/1992 | Moisin et al. | 315/291 |
| 5,173,643 | 12/1992 | Sullivan et al. | 315/276 |
| 5,177,408 | 1/1993 | Marques | 315/291 |
| 5,191,263 | 3/1993 | Konopka | 315/209 |
| 5,216,332 | 6/1993 | Nilssen | 315/224 |
| 5,220,247 | 6/1993 | Moisin | 315/209 |
| 5,223,767 | 6/1993 | Kulka | 315/209 R |
| 5,256,939 | 10/1993 | Nilssen | 315/244 |
| 5,291,382 | 3/1994 | Cohen | 363/56 |
| 5,309,066 | 5/1994 | Ditlevsen | 315/205 |
| 5,313,143 | 5/1994 | Vila-Masot et al. | 315/209 R |
| 5,315,533 | 5/1994 | Stich et al. | 364/480 |
| 5,332,951 | 7/1994 | Turner et al. | 315/209 |
| 5,334,912 | 8/1994 | Counts | 315/119 |
| 5,390,231 | 2/1995 | Hung et al. | 379/2 |
| 5,399,943 | 3/1995 | Chandrasekaran | 315/219 |
| 5,416,388 | 5/1995 | Shackle | 315/219 |
| 5,432,817 | 7/1995 | Hormel et al. | 375/257 |
| 5,434,477 | 7/1995 | Crouse et al. | 315/209 |
| 5,434,480 | 7/1995 | Bobel | 315/224 |
| 5,444,333 | 8/1995 | Lau | 315/94 |
| 5,446,365 | 8/1995 | Nomura et al. | 320/14 |
| 5,481,160 | 1/1996 | Nilssen | 315/209 R |
| 5,493,180 | 2/1996 | Bezdon et al. | 315/91 |
| 5,495,404 | 2/1996 | Stephens | 363/132 |
| 5,504,398 | 4/1996 | Rothenbuhler | 315/209 |
| 5,515,433 | 5/1996 | Chen | 379/398 |
| 5,563,479 | 10/1996 | Suzuki | 318/139 |
| 5,574,335 | 11/1996 | Sun | 315/119 |
| 5,579,197 | 11/1996 | Mengelt et al. | 361/93 |
| 5,583,402 | 12/1996 | Moisin et al. | 315/307 |
| 5,608,295 | 3/1997 | Moisin | 315/247 |
| 5,608,595 | 3/1997 | Gourab et al. | 361/79 |
| 5,638,266 | 6/1997 | Horie et al. | 363/132 |
| 5,684,683 | 11/1997 | Divan et al. | 33/65 |
| 5,686,799 | 11/1997 | Moisin et al. | 315/307 |
| 5,691,606 | 11/1997 | Moisin et al. | 315/307 |
| 5,767,657 | 6/1998 | Oglesbee | 320/5 |
| 5,793,127 | 8/1998 | Qualich | 327/108 |
| 5,798,617 | 8/1998 | Moisin | 315/247 |
| 5,825,136 | 10/1998 | Rudolph | 315/291 |
| 5,831,396 | 11/1998 | Rudolph | 315/307 |
| 5,866,993 | 2/1999 | Moisin | 315/307 |

INVERTER CIRCUIT WITH AVALANCHE CURRENT PREVENTION

CROSS REFERENCE TO RELATED APPLICATIONS

Not applicable.

STATEMENT REGARDING FEDERALLY SPONSORED RESEARCH

Not applicable.

FIELD OF THE INVENTION

The present invention relates to circuits having switching elements and more particularly, to a circuit having switching elements biased by inductive circuit elements.

BACKGROUND OF THE INVENTION

Many electrical circuits include switching elements for controlling operation of the circuit. One such type of circuit, is an inverter circuit adapted for operation at or near a resonant frequency of the circuit. An inverter circuit changes direct current (DC) power to alternating current (AC) power. An illustrative inverter circuit includes first and second switching elements coupled in a half-bridge configuration. The switching elements are controlled to facilitate resonant operation of the circuit. A circuit path to a load energized by the inverter circuit includes resistive, inductive and capacitive circuit elements coupled in various series and parallel arrangements.

Inverter circuits generally have diodes, known as free wheeling or antiparallel diodes, coupled across terminals of the switching elements such that the diodes are biased into a conduction state when the switching element is biased into its non-conduction state and vice-versa. These diodes become conductive for a period of time during which none of the bridge switching elements are conductive. This time is commonly referred to as dead time. During the dead time, the free wheeling diodes provide a discharge path for energy stored in the resonant inductive and capacitive circuit elements. As known to one of ordinary skill in the art, if the charge stored in the circuit elements is not provided with a discharge path, the energy will resonate in parasitic capacitive and inductive circuit elements. Such resonance will generate high voltages and frequencies that could destroy circuit elements.

While the free wheeling diodes provide a discharge path during the dead time, these diodes do not prevent avalanche current flow through the switching elements. The voltage drop across a conductive free wheeling diode can reverse bias a switching element thereby facilitating avalanche current flow through the switching element. The undesirable avalanche current flow can damage the switching element and may reduce the reliability of the switching element and any circuit which includes the switching element. Avalanche current flow will also slow switching element transitions between conductive and non-conductive states due to the time required for the stored energy from the avalanche current to discharge.

It would, therefore, be desirable to provide a circuit having switching elements that are biased to reduce or eliminate avalanche current flow.

SUMMARY OF THE INVENTION

The present invention provides a circuit that reduces or eliminates avalanche current flow through circuit switching elements. Although the circuit is primarily shown and described as a resonant inverter circuit, it is understood that the circuit has other applications as well.

In one embodiment, a resonant inverter circuit in accordance with the present invention includes first and second switching elements with a first inductive element coupled therebetween. A first freewheeling diode is coupled across the first switching element and a second freewheeling diode is coupled across the second switching element. A first bias element having an inductive impedance characteristic is coupled to the first switching element and a second bias element having an inductive impedance characteristic is coupled to the second switching element. The first and second bias elements are inductively coupled to the first inductive element such that the bias elements reduce or eliminate avalanche current through a respective switching element.

In operation, each of the first and second switching elements are switched at a duty cycle slightly less than fifty percent. The first switching element is conductive for about one-half of a resonant cycle as current flows in a first direction and the second switching element is conductive for the other half of the resonant cycle as current flows in an opposite direction. If the first and second switching elements are simultaneously conductive, the positive and negative rails of the inverter are shorted together. This is referred to as cross conduction. To prevent cross conduction, there is a period of time known as dead time where the first and second switching elements are non-conductive. During the dead time, one of the first and second freewheeling diodes provides a discharge signal path to discharge energy stored in the inductive and capacitive circuit elements. The first bias element negates reverse biasing of the first switching element by a voltage drop across the conductive first diode. By preventing reverse biasing of the first switching element, avalanche current flow can be reduced or in some instances eliminated. Similarly, the second bias element prevents or eliminates avalanche current flow through the second switching element as the second diode conducts current.

BRIEF DESCRIPTION OF THE DRAWINGS

The invention will be more fully understood from the following detailed description taken in conjunction with the accompanying drawings, in which.

DETAILED DESCRIPTION

Figure 1:
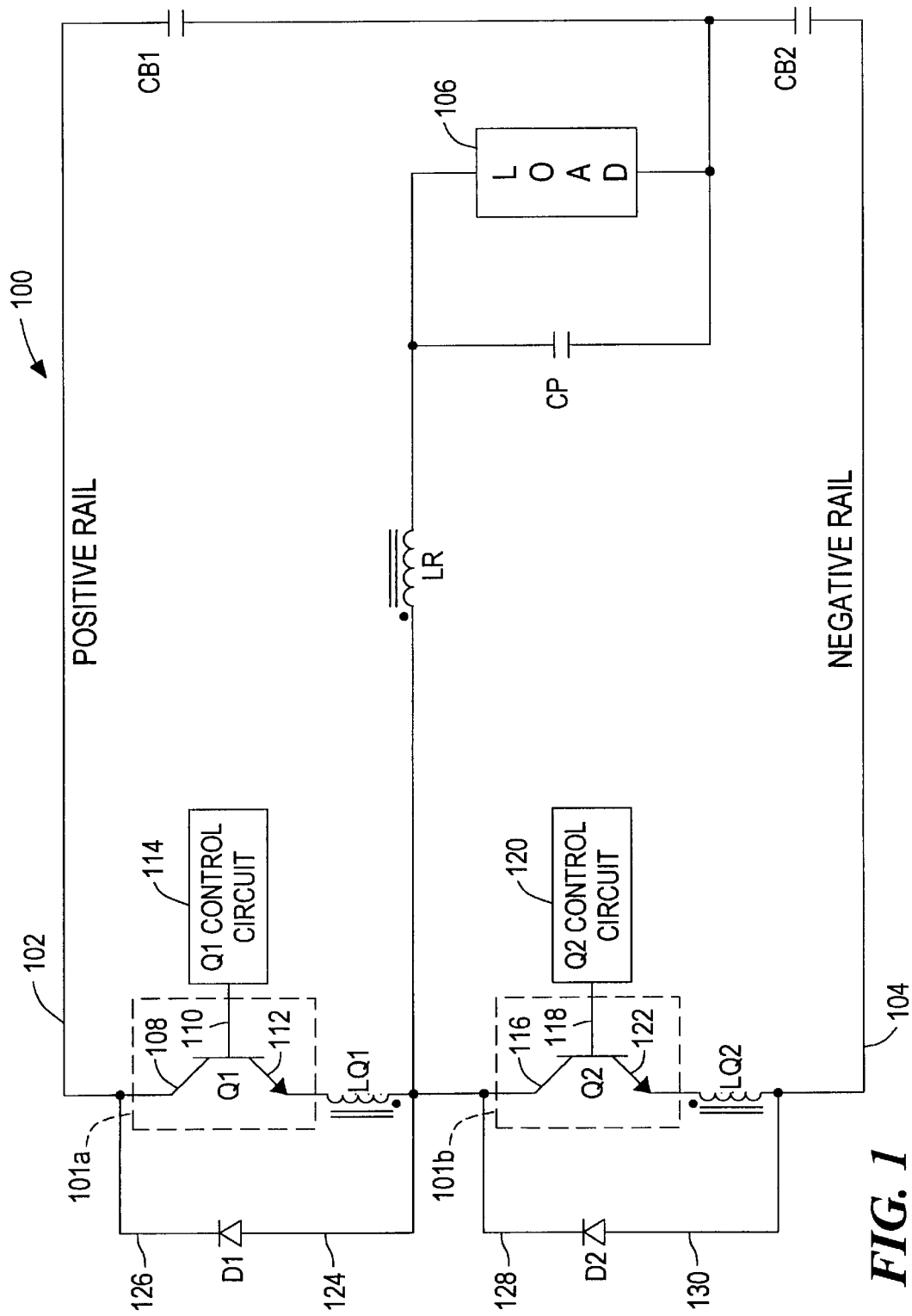
FIG. 1 is a circuit diagram of an exemplary circuit in accordance with the present invention.
Figure 2:
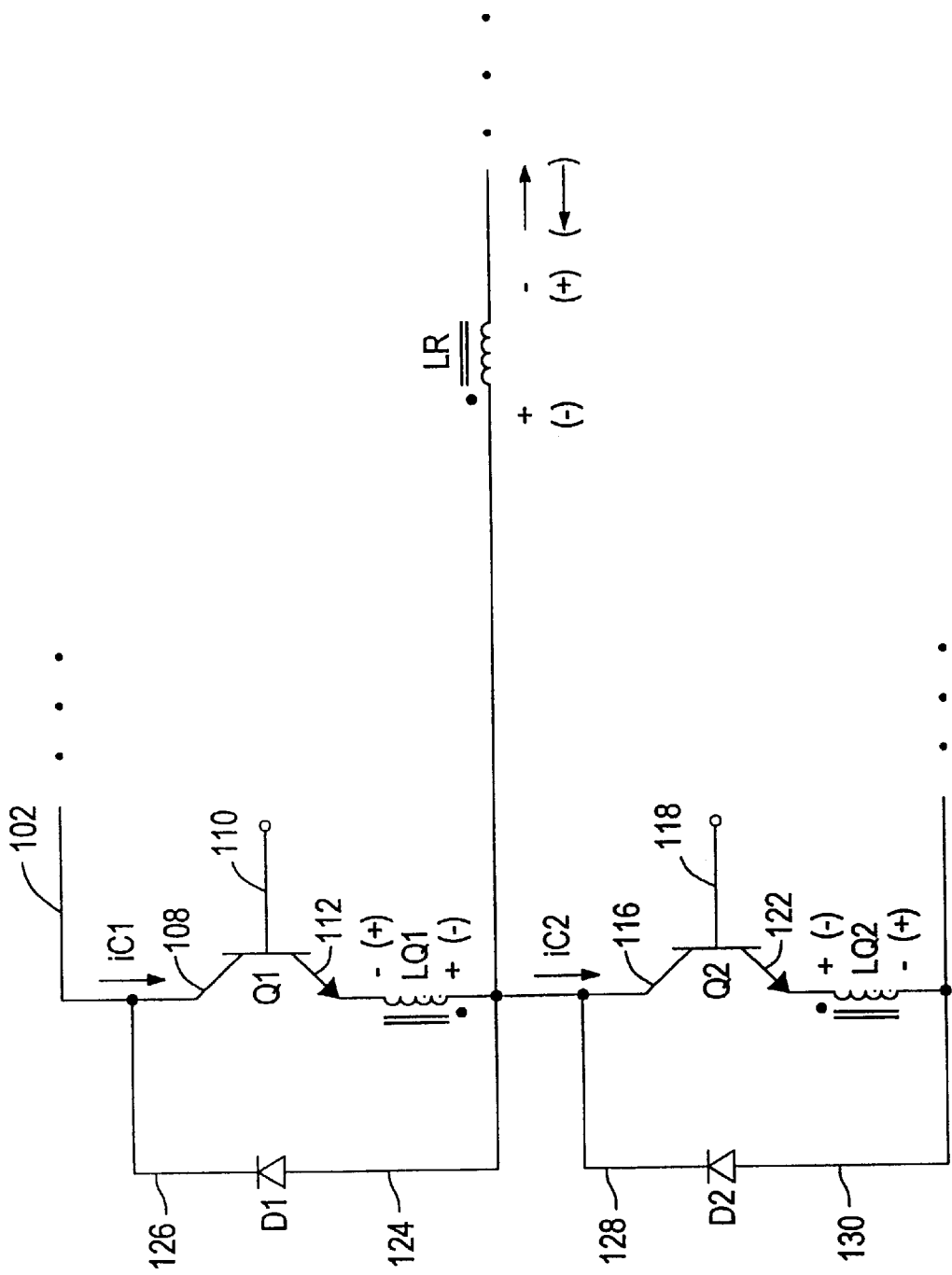
FIG. 2 is a circuit diagram of a part of the circuit of FIG. 1.
Figure 3:
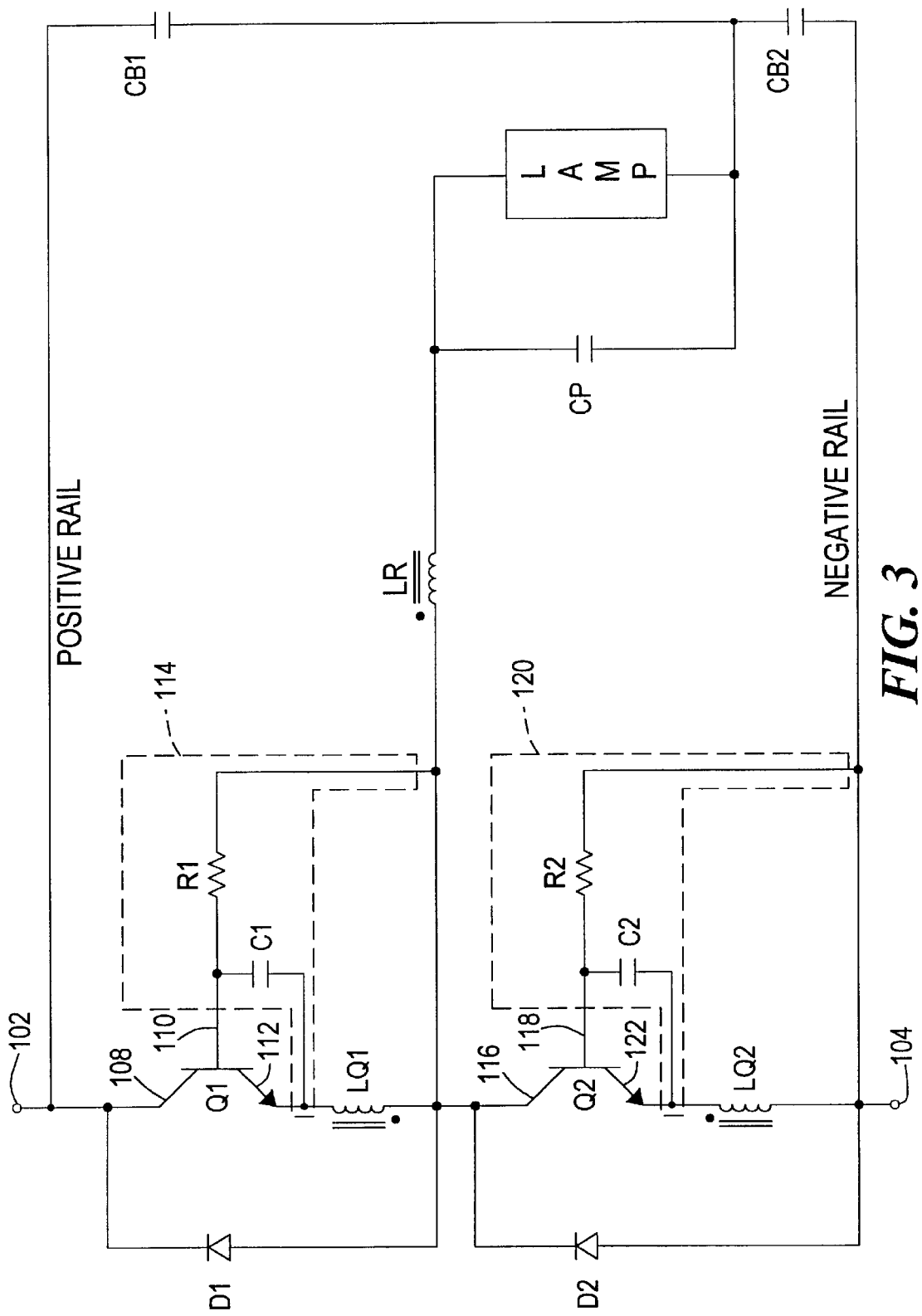
FIG. 3 is a further embodiment of a circuit in accordance with the present invention.

Referring now to FIGS. 1–3 in which like elements are provided having like reference designations, an exemplary embodiment of a circuit 100, here corresponding to a resonant inverter circuit, in accordance with the present invention is shown. The inverter circuit 100 includes first and second switching elements 101a, 101b here shown as transistor switches Q1,Q2, coupled in a half-bridge configuration. The first switching element Q1 is coupled to a positive rail 102 of the inverter and the second switching element Q2 is coupled to a negative rail 104. Coupled between the first and second switching elements Q1,Q2 are a resonant inductive element LR and a resonant capacitive element CP. A load 106, such as a fluorescent lamp, is coupled in parallel with the resonant capacitive element CP. The circuit 100 can also include a first bridge capacitor CB1 coupled in between the load 106 and the positive rail 102 and a second bridge capacitor CB2 coupled between the load and the negative rail 104.

The first and second switching elements 101a,b can be formed from bipolar junction transistors (BJTs), field effect transistors (FETs), or other switching elements known to one of ordinary skill in the art. The switching elements 101a, 101b can also be formed from a plurality of switching elements and/or integrated circuits. In an exemplary embodiment, the first switching element Q1 is a BJT with a first or collector terminal 108 coupled to the positive rail 102, a second or base terminal 110 coupled to a first control circuit 114 and a third or emitter terminal 112 coupled to a first terminal of a first inductive element LQ1. A collector terminal 116 of the second switching element Q2 is coupled to a second terminal of the resonant inductive element LR, a base terminal 118 is coupled to a second control circuit 120 and an emitter terminal 122 is coupled to a second inductive element LQ2. The second inductive element LQ2 is coupled between the emitter terminal 122 of the second switching element Q2 and the negative rail 104. The first and second control circuits 104,106 control the conduction state of the respective first and second switching elements Q1,Q2 to facilitate resonant operation of the inverter circuit 100. Exemplary control circuits for controlling the switching elements Q1,Q2 are disclosed in U.S. Pat. Nos. 5,124,619 (Moisin et al.), U.S. Pat. No. 5,138,234 (Moisin), and U.S. Pat. No. 5,138,236 (Bobel et al.), all incorporated herein by reference.

Coupled across the first switching element Q1 is a first diode D1, commonly referred to as a free wheeling or antiparallel diode. Similarly, a second free wheeling diode D2 is coupled across the second switching element Q2. In the exemplary embodiment shown, the first inductive element LQ1 is coupled between an anode 124 of the first free wheeling diode D1 and the emitter terminal 112 of the first switching element Q1. A cathode 126 of the first diode D1 is coupled to the collector terminal 108 of the first switching element Q1. The second free-wheeling diode D2 has a cathode 128 coupled to the collector terminal 116 of the second switching element Q2 and an anode 130 coupled to the second inductive element LQ2. The second inductive element LQ2 is coupled between the anode 130 of the second diode D2 and the emitter terminal 1–22 of the second switching element Q2. The anode 130 is also coupled to the negative rail 104 of the inverter.

The first and second inductive elements LQ1,LQ2 are inductively coupled to the resonant inductive element LR. The first inductive element LQ1 has a polarity indicated by a dot as shown, in accordance with conventional dot notation. Similarly, the second inductive element LQ2 has a polarity as indicated by a dot as shown. As known to one of ordinary skill in the art, the dot indicates a rise in voltage from the unmarked to the marked terminal. For example, current flowing into the dot on a primary side of a transformer has a positive polarity. The first and second inductive elements LQ1,LQ2 reduce or eliminate avalanche current flow from the respective collector terminals 108,116 to the base terminal 110,118 by biasing the respective first and second switching elements Q1,Q2, as described below.

In operation, the inverter circuit operates at or near a characteristic resonant frequency of the circuit with the first and second switching elements Q1,Q2 alternately conducting current. It is understood that the switching elements Q1,Q2 have a conductive or ON state in which current flows through the switching element and a nonconductive or OFF state in which state current does not flow through the switching element. An inverter circuit driving a load having resistive, capacitive and inductive impedance characteristics is generally referred to a resonant inverter circuit. As known to one of ordinary skill in the art, the resistive, capacitive and inductive elements, here the load 106, the resonant capacitive element CP and the resonant inductive element LR, determine the resonant frequency for the circuit. During resonant operation of the circuit, a generally sinusoidal current flows to the load 106. The AC load current flows through the resonant elements LR, CP and the load 106 in a first direction during a first part of a resonant cycle and in a second, opposite direction during a second part of the resonant cycle. The first switching element Q1 is conductive as the current flows in a direction from the resonant inductive element LR to the load 106 and the second switching element Q2 is conductive as current flows from the load 106 to the resonant inductive element LR.

To prevent cross conduction, the first and second switching elements Q1,Q2 should not be biased into their conductive states at the same time. If the first and second switching elements Q1,Q2 are conductive simultaneously, the switches provide a signal path having a relatively low resistance characteristic (e.g., a short circuit) between the positive and negative rails 102,104. A resultant current could destroy circuit elements. To ensure that cross conduction does not occur as the switching elements Q1,Q2 transition between conduction states, the first and second control circuits Q1,Q2 provide a period of time, referred to as dead time, where both the first and second switching elements Q1,Q2 are biased into their non-conduction or OFF state. However, when both switching elements Q1,Q2 are biased into their OFF state, energy stored in the inductive and capacitive circuit elements, e.g., LR, CP, can produce one or more parasitic resonant signals having relatively high frequencies and relatively high voltages. Such resonant signals may damage circuit elements exposed thereto. To prevent or reduce the occurrences of the parasitic resonant signals, a dissipation signal path is used to discharge the energy stored in circuit elements such as inductive element LR and capacitive element CP.

The first and second free wheeling diodes D1,D2 provide the dissipation circuit path through which circuit elements discharge stored energy during the dead time when both the first and second switching elements Q1,Q2 are OFF. The order in which the switching elements Q1,Q2 and the diodes D1,D2 are conductive depends upon whether the load is underdamped or overdamped. If the load 106 is purely resistive, i.e., not underdamped or overdamped, the free wheeling diodes D1,D2 do not conduct. If the circuit operates at a frequency below the resonant frequency, i.e., the load is underdamped, a conduction sequence is: first switching element Q1; first diode D1; second switching element Q2; and second diode D2. For circuit operation at a frequency above resonance, i.e., overdamped, the conduction sequence is: first diode D1; first switching element Q1.; second diode D2; and second switching element Q2.

Looking more closely at circuit operation above resonance and to an exemplary transition from the first switching element Q1 switching OFF to the second switching element Q2 switching ON, it can be seen that the second inductive bias element LQ2 reduces or eliminates avalanche current flow from the collector 116 to the base 118 of the second switching element Q2. As the first switching element Q1 turns OFF, the second diode D2 turns ON. When the first switching element Q1 is turned OFF by the first control circuit 114, the voltage across the first diode D1 increases which causes the voltage across the second diode D2 to concomitantly increase. At about 0.7 Volts (−0.7V with respect to the collector 116 and emitter 122 of Q2), the second diode D2 turns ON. The voltage drop across diode D2 creates a reverse bias with respect to second switching element Q2.

However, the reverse bias of the second switching element Q2 by diode D2 is counterbalanced by a potential of the second bias element LQ2 so that avalanche current does not flow from the collector 116 to the base 118 of the second switching element Q2. Avalanche current flows through the collector-base junction of an npn transistor occurs when the collector is at a more negative potential than the emitter. The second bias element LQ2 applies a bias to the emitter 122 of the second switching element Q2 to prevent avalanche current flow by forcing the emitter to a potential that is more negative than the potential of the collector.

FIG. 2 shows the polarities of the bias elements LQ1,LQ2 with respect to the resonant inductive element LR as indicated with conventional dot notation. Voltage polarities are indicated with a "+" for a positive voltage and a "−" for a negative voltage. The respective voltage polarities for the inductive circuit elements LR,LQ1,LQ2 for current flow while Q1 is ON are shown without parentheses. As Q1 turns OFF, the voltage polarities switch and are shown in parentheses.

The switch in voltage polarity of the second switching element LQ2 provides a negative bias to the emitter 122 of the second switching element Q2. This negative bias offsets the reverse bias applied to the second switching element Q2 by the conductive second diode D2. By maintaining the emitter 122 at a lower voltage potential than the collector 116, avalanche current flow from the collector 116 to the base 118 of the second bias element Q2 is reduced or eliminated.

Similarly, the first bias element LQ1 provides a negative bias to the emitter 112 of the first switching element Q1 when the first diode D1 is conductive prior to the first switching element Q1 transitioning to the ON state. This occurs as the second switching element Q2 turns OFF. Avalanche current flow from the collector 108 of the first switching element Q1 to the emitter 110 is prevented by the bias of the emitter 112 by the first bias element LQ1.

This circuit arrangement provides a more reliable circuit since the switching elements are not subject to avalanche current flow. The switching elements Q1,Q2 are also more consistent in operation since they are not saturated and unknown times for charge stored in the collector-base junction to discharge are not required. Since energy is not stored in the collector-base junction, the switching element can transition between conduction states more rapidly. Further, the impedance provided by the first and second bias elements limits current flow through the first and second switching elements should cross conduction occur.

FIG. 3 shows a further embodiment of an inverter circuit, and in particular the first and second control circuits 114, 120, in accordance with the present invention, wherein like reference designations represent like elements. The first control circuit 114 is coupled to the base 110 of the first switching element Q1 and includes a first resistor R1 coupled between the base and the first bias element LQ1. A first capacitor C1 is coupled between the base 110 and emitter 112 of the first switching element. Similarly, the second control circuit 120 includes a second capacitor C2 coupled between the base and emitter terminals 118, 122 of the second switching element Q2. A second resistor R2 is coupled between the base 118 of the second switching element Q2 and the negative rail 104 of the inverter. This arrangement references the base of the switching element Q2 to the negative rail, thus making the circuit less sensitive to parametric variations of the switching element, e.g., transistor.

Figure 4:
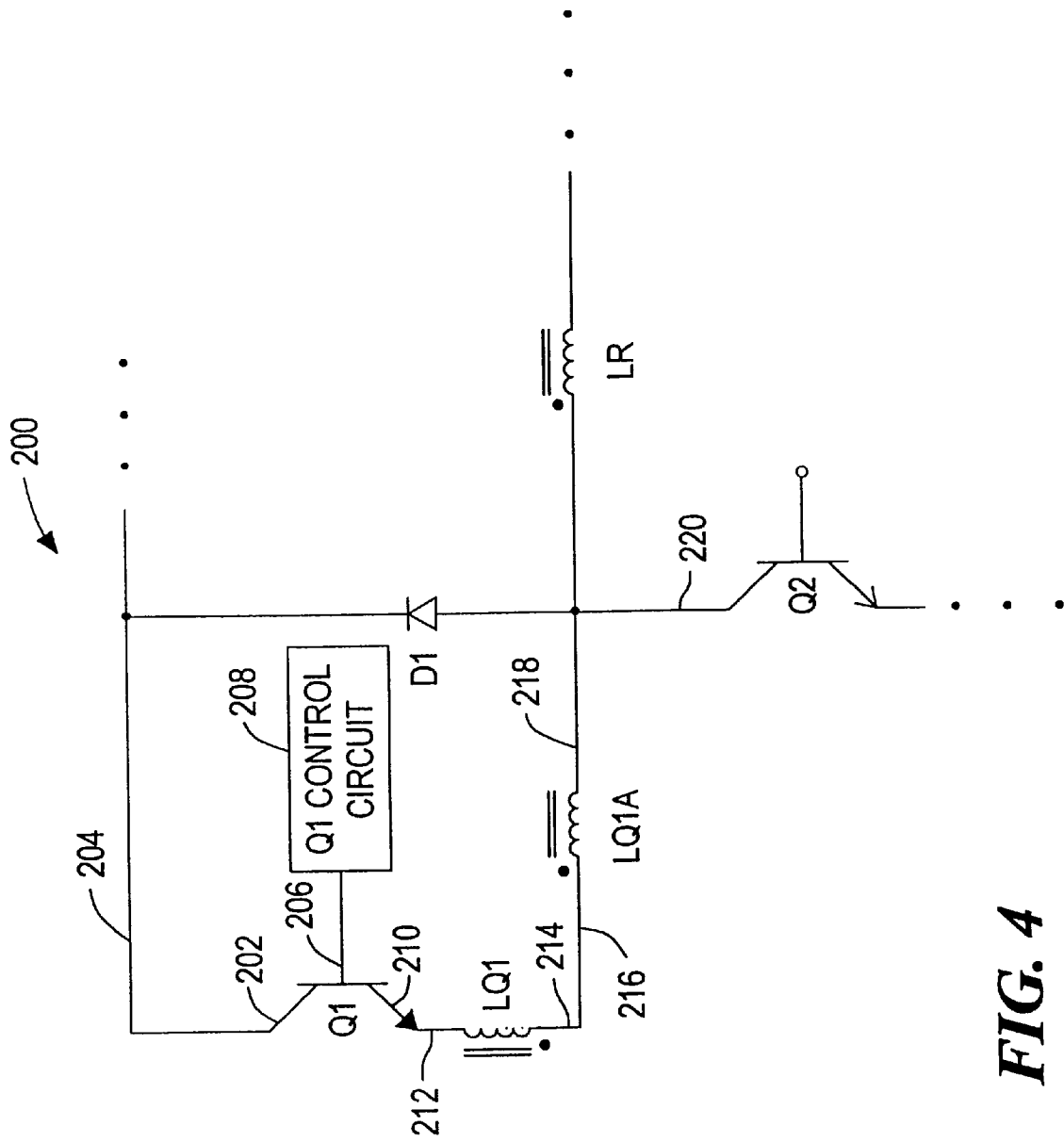
FIG. 4 is another embodiment of a circuit in accordance with the present invention.

FIG. 4 is another exemplary embodiment of a circuit 200 providing avalanche current prevention, wherein like reference designation indicate like elements. The circuit 200 shows a part of an inverter circuit including first and second switching elements Q1,Q2 coupled in a half bridge configuration. The switching elements Q1,Q2 are shown as npn transistors. The first switching element Q1 has a collector terminal 202 coupled to a positive rail 204 of the inverter, a base terminal 206 coupled to a control circuit 208 and an emitter terminal 210 coupled to a first inductive bias element LQ1.

The first inductive bias element LQ1 has a first terminal 212 coupled to the emitter terminal 210 of the first switching element Q1 and a second terminal 214 coupled to a first terminal 216 of a loop inductive element LQ1A. A first antiparallel diode D1 is coupled between a second terminal 218 of the loop inductive element LQ1A and the positive rail 204 of the inverter. In an exemplary embodiment, the second terminal 218 of the loop inductive element LQ1A is also coupled to a resonant inductive element LR and a collector 220 of the second switching element Q2.

As described above in conjunction with FIGS. 1–3, the first inductive bias element LQ1 is effective to reduce or prevent avalanche current from flowing through the first switching element Q1 by forcing the emitter terminal 210 to a more negative potential than that of the collector terminal 202 when the first antiparallel diode D1 is conductive. This occurs immediately after the second switching element Q2 turns off but before the first switching element Q1 turns on, i.e., the dead time.

While the first inductive bias element LQ1 prevents avalanche current flow, the voltage across this inductive element tends to cause to a current flow through a circuit loop including the first diode D1 and the first switching element Q1. However, the loop inductive bias element LQ1A is effective to limit or minimize the current flowing through this circuit loop. Looking to the respective polarities (indicated by conventional dot notation) of the first inductive bias element LQ1 and the loop inductive bias element LQ1A, it can be seen that these elements are of opposite polarity. The loop inductive bias element LQ1A therefore reduces the voltage that appears across the remainder of the circuit loop elements, e.g., the first diode D1 and the first switching element Q1. By reducing this voltage, the amount of current flowing through the D1/Q1 circuit loop is also reduced.

The impedance characteristics of the first inductive bias element LQ1 as compared with the loop inductive element LQ1A can vary. In general, the number of turns of the loop inductive element LQ1A is less than or equal to the number of turns of the first inductive bias element LQ1. In one embodiment, the first inductive bias element LQ1 and the loop inductive element LQ1A each have three turns.

Figure 5:
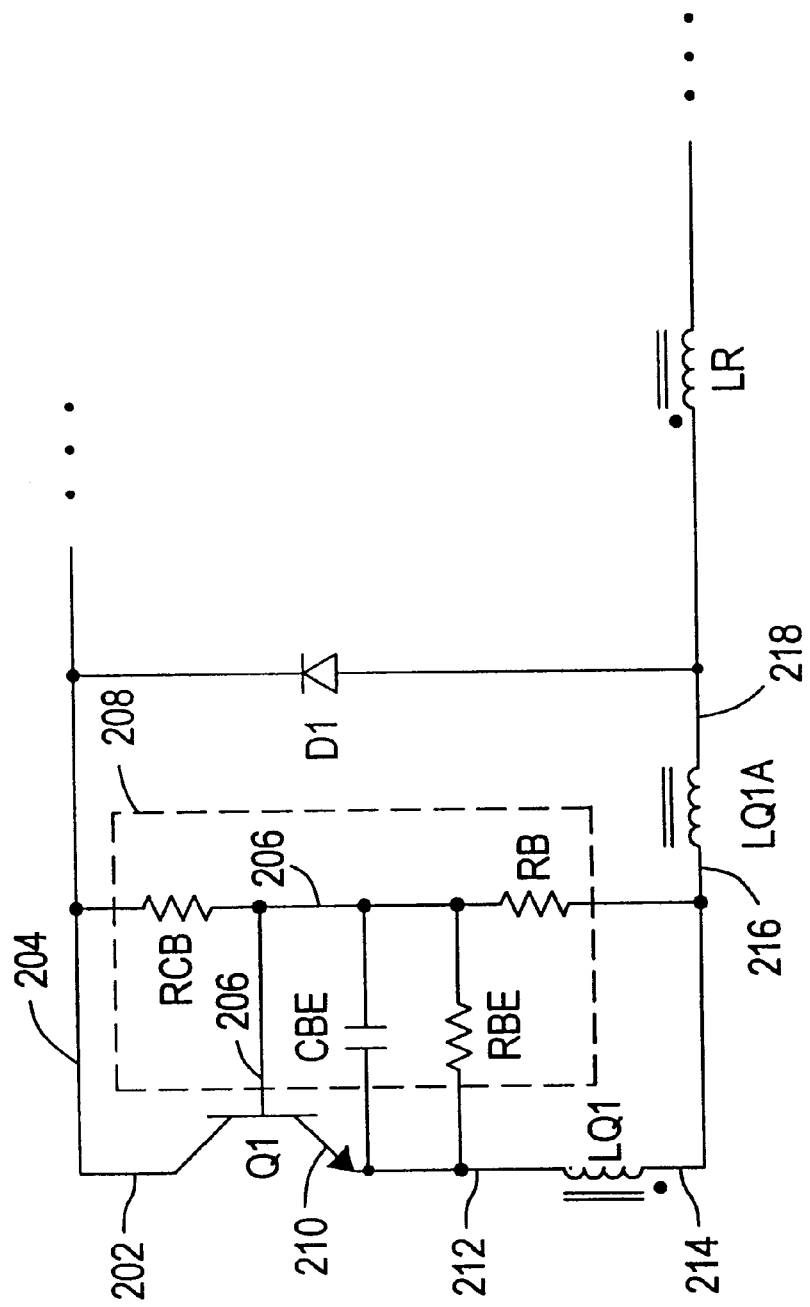
FIG. 5 is a circuit diagram of an exemplary embodiment of a part of the circuit of FIG. 4.

FIG. 5 is an exemplary embodiment of the control circuit 208 of FIG. 4. The control circuit includes a collector-base resistor RCB and a base resistor RB coupled in series between the positive rail 204 of the inverter and a point between the first inductive bias element LQ1 and the loop inductive element LQ1A. The base terminal 206 of the first switching element Q1 is coupled to a node 207 between the series-coupled resistors RCB,RB. A base-emitter capacitor CBE is coupled between the emitter terminal 210 and the node 207. A base-emitter resistor RBE is also coupled between the emitter terminal 210 and the node 207. The resulting R-C network is effective to control the conduction state of the first switching element Q1 during resonant operation of the inverter circuit 200. It is understood that a similar R-C network can control the conduction state of the second switching element Q2.

It is understood that the inverter circuit of the present invention is not limited to the particular embodiments shown. For example, in another embodiment, an inverter can be formed in a full bridge configuration with additional switching elements. Also, the configuration of the resonant inductive and capacitive elements and load can be coupled in various combinations such as parallel loaded (FIG. 1), series-parallel loaded, and various other arrangements known to one skilled in the art.

One of ordinary skill in the art will realize further features and advantages of the invention from the above-described embodiments. Accordingly, the invention is not to be limited by what has been particularly shown and described, except as indicated by the appended claims. All references cited herein are expressly incorporated by reference in their entirety.

What is claimed is:

1. A circuit, comprising:
   a resonant circuit including a first switching element and a resonant inductive element for coupling to a load, the first switching element having a first terminal, a second terminal and a third terminal;
   a first control circuit coupled to the second terminal of the first switching element for controlling a conduction state of the first switching element to facilitate resonant operation of the circuit;
   a first diode having a first terminal and a second terminal, the first terminal of the first diode being coupled to the first terminal of the first switching element;
   a first inductive bias element inductively coupled to the resonant inductive element, the first bias element having a first terminal and a second terminal, the first bias element first terminal being coupled to the third terminal of the first switching element and the first bias element second terminal being coupled to the second terminal of the first diode, the first bias element for biasing the first switching element against avalanche current flow from the first terminal to the second terminal of the first switching element.

2. The circuit according to claim 1, wherein the first switching element is a bipolar junction transistor having collector, base and emitter terminals.

3. The circuit according to claim 2, wherein the first bias element biases the emitter terminal of the first switching element against avalanche current flow from the collector terminal to the base terminal.

4. The circuit according to claim 1, wherein the circuit is a resonant inverter circuit.

5. The circuit according to claim 4, wherein the first switching element is coupled to a positive rail of the inverter and further including a second switching element coupled to a negative rail of the inverter and to the first switching element in a half bridge configuration.

6. The circuit according to claim 5, further including a second inductive bias element coupled to the second switching element for biasing the second switching element against avalanche current flow.

7. The circuit according to claim 6, wherein the second bias element is inductively coupled with the resonant inductive element.

8. The circuit according to claim 4, wherein the inverter circuit operates at a frequency greater than a resonant frequency of the inverter circuit.

9. The circuit according to claim 1, further including a second switching element coupled to the first switching element, the second switching element having a first terminal, a second terminal and a third terminal.

10. The circuit according to claim 9, further including a second current switch element coupled across the first and third terminal of the second switching element.

11. The circuit according to claim 10, further including a second bias element coupled to a third terminal of the second switch element.

12. The circuit according to claim 1, wherein the first control circuit comprises an RC network.

13. The circuit according to claim 12, wherein the RC network couples the second and third terminals of the first switching element.

14. A circuit, comprising:
   a resonant circuit including a first switching element and a resonant inductive element for coupling to a load, the first switching element having a first terminal, a second terminal and a third terminal;
   a first inductive bias element inductively coupled to the resonant inductive element, the first bias element being coupled to the first switching element for biasing the first switching element against avalanche current flow; and
   a loop inductive element inductively coupled to the first bias element.

15. The circuit according to claim 14, wherein the loop inductive element and the first bias element have opposite polarities.

16. The circuit according to claim 15, wherein the loop inductive element and the first bias element have similar impedance characteristics.

17. A circuit, comprising:
   a resonant circuit including a first switching element and a resonant inductive element for coupling to a load, the first switching element having a first terminal, a second terminal and a third terminal;
   a first inductive bias element inductively coupled to the resonant inductive element, the first bias element being coupled to the first switching element for biasing the first switching element against avalanche current flow, wherein the first bias element biases the first switching element against avalanche current flowing from the first terminal to the second terminal of the first switching element; and
   a loop inductive element inductively coupled to the first bias element, the loop inductive element and the first bias element being coupled in series.

18. A resonant inverter circuit, comprising:
   a first switching element having a first terminal, a second terminal and a third terminal;
   a second switching element having a first terminal, a second terminal and a third terminal, the second switching element being coupled to the first switching element in a half bridge configuration;

a resonant inductive element coupled between the first and second switching elements;

a first diode having first and second terminals, the first diode first terminal being coupled to the first terminal of the first switching element;

a second diode having first and second terminals, the second diode first terminal being coupled to the first terminal of the second switching element;

a first inductive bias element having first and second terminals, the first bias element first terminal being coupled to the third terminal of the first switching element and the first bias element second terminal being coupled to the first diode second terminal, the first bias element being inductively coupled to the resonant inductive element; and a second inductive bias element having first and second terminals, the second bias element first terminal coupled to the third terminal of the second switching element and the second bias element second terminal being coupled to the second diode second terminal, the second bias element being inductively coupled to the resonant inductive element, wherein the first bias element has a polarity with respect to a polarity of the resonant inductive element such that the first bias element biases the third terminal of the first switching element to inhibit avalanche current flow from the first terminal to the second terminal of the first switching element when the first diode is conductive.

19. A resonant inverter circuit, comprising:

a first switching element having a first terminal, a second terminal and a third terminal;

a second switching element having a first terminal, a second terminal and a third terminal, the second switching element being coupled to the first switching element;

a resonant inductive element coupled between the first and second switching elements;

a first diode coupled across the first and third terminals of the first switching element;

a second diode coupled across the first and third terminals of the second switching element;

a first inductive bias element coupled to the third terminal of the first switching element, the first bias element being inductively coupled to the resonant inductive element; and a second inductive bias element coupled to the third terminal of the second switching element, the second bias element being inductively coupled to the resonant inductive element, wherein the first bias element has a polarity with respect to a polarity of the resonant inductive element such that the first bias element biases the first switching element to resist avalanche current flow when the first diode is conductive; and a loop inductive element inductively coupled to the first bias element in opposite polarity, the loop inductive element and the first bias element being coupled in series.

20. The circuit according to claim 19, wherein the loop inductive element is effective to limit current flow through the first diode when the first diode is conductive.

21. A circuit, comprising:

a resonant circuit including a first switching element and a resonant inductive element for coupling to a load, the first switching element having a first terminal, a second terminal and a third terminal;

a first inductive bias element inductively coupled to the resonant inductive element, the first bias element being coupled to the first switching element for biasing the first switching element against avalanche current flow; and a first loop inductive element inductively coupled to the first bias element, the first loop inductive element being coupled to the first bias element and the resonant inductive element.

22. The circuit according to claim 21, wherein the first bias element and the first loop inductive element are of opposite polarity.

23. The circuit according to claim 21, wherein the first bias element and the first loop inductive element have similar impedance characteristics.

24. The circuit according to claim 21, wherein the circuit is a resonant inverter circuit and further includes an antiparallel diode coupled across the first switching element, wherein the loop inductive element is effective to reduce a current flow through the antiparallel diode.

* * * * *